US009037213B2

(12) United States Patent
Roth et al.

(10) Patent No.: US 9,037,213 B2
(45) Date of Patent: May 19, 2015

(54) METHOD AND APPARATUS TO ESTIMATE LOCATION AND ORIENTATION OF OBJECTS DURING MAGNETIC RESONANCE IMAGING

(75) Inventors: Abraham Roth, Kefar Hasiddim (IL); Erez Nevo, Baltimore, MD (US)

(73) Assignee: ROBIN MEDICAL INC., Baltimore, MD (US)

( * ) Notice: Subject to any disclaimer, the term of this patent is extended or adjusted under 35 U.S.C. 154(b) by 407 days.

(21) Appl. No.: 12/812,077

(22) PCT Filed: Jan. 8, 2009

(86) PCT No.: PCT/IB2009/050074
§ 371 (c)(1),
(2), (4) Date: Jul. 8, 2010

(87) PCT Pub. No.: WO2009/087601
PCT Pub. Date: Jul. 16, 2009

(65) Prior Publication Data
US 2010/0280353 A1 Nov. 4, 2010

Related U.S. Application Data

(60) Provisional application No. 61/019,614, filed on Jan. 8, 2008, provisional application No. 61/023,894, filed on Jan. 28, 2008.

(51) Int. Cl.
*A61B 5/05* (2006.01)
*G01R 33/028* (2006.01)
*G01R 33/28* (2006.01)

(52) U.S. Cl.
CPC ............ *G01R 33/028* (2013.01); *G01R 33/287* (2013.01)

(58) Field of Classification Search
USPC .................. 600/407, 410, 424, 411, 421–423
See application file for complete search history.

(56) References Cited

U.S. PATENT DOCUMENTS

| 5,947,900 | A | * | 9/1999 | Derbyshire et al. | 600/410 |
| 6,492,814 | B1 | * | 12/2002 | Watkins et al. | 324/318 |
| 6,516,213 | B1 | * | 2/2003 | Nevo | 600/424 |
| 6,871,086 | B2 | * | 3/2005 | Nevo et al. | 600/424 |
| 2006/0074296 | A1 | * | 4/2006 | Dumoulin et al. | 600/424 |

* cited by examiner

*Primary Examiner* — Katherine Fernandez
(74) *Attorney, Agent, or Firm* — Daniel J. Swirsky; Rochel L. Simon; AlphaPatent Associates Ltd.

(57) ABSTRACT

Tracking based on the gradient fields of magnetic resonance imaging (MRI) scanners based on passive operation of the tracking system without any change of the scanner's hardware or mode of operation. To achieve better tracking performance, a technique to create a custom MRI pulse sequence is disclosed. Through this technique any standard pulse sequence of the scanner can be modified to include gradient activations specifically designated for tracking. These tracking gradient activations are added in a way that does not affect the image quality of the native sequence. The scan time may remain the same as with the native sequence or longer due to the additional gradient activations. The tracking system itself can use all the gradient activations (gradient activations for imaging and gradient activations for tracking) or eliminate some of the gradients and lock onto the specific gradient activations that are added to the custom pulse sequence.

28 Claims, 9 Drawing Sheets

METHOD AND APPARATUS TO ESTIMATE LOCATION AND ORIENTATION OF OBJECTS DURING MAGNETIC RESONANCE IMAGING

The present application is a U.S. National Phase Application under 35 U.S.C. 371 of PCT International Application No. PCT/IB2009/050074, which has an international filing date of Jan. 8, 2009, and which claims priority from U.S. Provisional Patent Application No. 61/019,614, filed Jan. 8, 2008, and U.S. Provisional Patent Application No. 61/023,894, filed Jan. 28, 2008, the contents of which are incorporated herein by reference.

FIELD OF THE INVENTION

The present invention relates to methodology and apparatus to determine the location and orientation of an object, for example a medical device, located inside or outside a body, while the body is being scanned by magnetic resonance imaging (MRI). More specifically, the invention enables estimation of the location and orientation of various devices (e.g. catheters, surgery instruments, biopsy needles, etc.) by measuring electrical potentials induced by time-variable magnetic fields in a set of miniature coils.

BACKGROUND OF THE INVENTION

Minimally invasive procedures: Minimally-invasive diagnostic or interventional procedures require either direct visual viewing or indirect imaging of the field of operation and determination of the location and orientation of the operational device. For example, laparoscopic interventions are controlled by direct viewing of the operational field with rigid endoscopes, while flexible endoscopes are commonly used for diagnostic and interventional procedures within the gastro-intestinal tract. Vascular catheters are manipulated and maneuvered by the operator, with real-time X-ray imaging to present the catheter location and orientation. Ultrasound imaging and new real-time MRI and CT scanners are used to guide diagnostic procedures (e.g. aspiration and biopsy) and therapeutic interventions (e.g. ablation, local drug delivery) with deep targets. While the previous examples provide either direct (optical) or indirect (imaging) view of the operation field and the device, another approach is based on remote sensing of the device with mechanical, optical or electromagnetic means to determine the location and orientation of the device inside the body.

Stereotaxis: Computer-assisted stereotaxis is a valuable technique for performing diagnostic and interventional procedures, most typically with the brain. The concept behind the technique is to have real-time measurement of the device location in the same coordinate system as an image of the field of operation. The current location of the device and its future path are presented in real-time on the image and provide the operator with feed-back to manipulate the device with minimal damage to the organs. During traditional stereotaxis, the patient wears a special halo-like headframe, which provides the common coordinate system, and CT or MRI scans are performed to create a three-dimensional computer image that provides the exact location of the target (e.g. tumour) in relation to the headframe. The device is mechanically attached to the frame and sensors provide its location in relation to the head frame. When this technique is used for biopsy or minimally-invasive surgery of the brain, it guides the surgeon in determining where to make a small hole in the skull to reach the target. Newer technology is the frameless technique, using a navigational wand without the headframe (e.g. Nitin Patel and David Sandeman, "A Simple Trajectory Guidance Device that Assists Freehand and Interactive Image Guided Biopsy of Small Deep Intracranial Targets", Comp Aid Surg 2:186-192, 1997). In this technique remote sensing system (e.g. light sources and sensors) provides the real-time location of the device with respect to the image coordinate system. Yet both the stereotaxis and the frameless techniques are typically limited to the use of rigid devices like needles or biopsy forceps since their adequate operation requires either mechanical attachments or line of sight between the light sources and the sensors.

Electromagnetic remote sensing: Newer remote sensing techniques are based on electromagnetism. For example, the Bladen and Anderson technique (WO 94/04938) is an active electromagnetic tracking methodology that requires the use of electromagnetic field generator or generators to determine the location and orientation of a sensor (Page 3 lines 17-36; Page 4 line 24 through Page 5 line 9). This methodology cannot be directly used during MRI because the application of an external electromagnetic field creates an unacceptable level of image artifacts. These artifacts can be avoided by interleaving the tracking step with the image acquisition step, which requires a modification of the MRI pulse sequences and lengthens the imaging time. It also requires mechanical modification of the scanner, to add the field generators into the structure of the scanner. The addition of conducting elements to the scanner (the coils of the generators) may result in substantial artifacts due to the creation of eddy currents and may create electromagnetic interference with the scanner. Acker et al (U.S. Pat. No. 5,558,091) disclose such a method and apparatus to determine the position and orientation of a device inside the body. This method uses magnetic fields generated by Helmholtz coils, and a set of orthogonal sensors to measure components of these fields and to determine the position and orientation from these measurements. The measurement of the magnetic field components is based on Hall effect and requires exciting currents in the sensors in order to generate the measured signals. The technique requires control of the external magnetic fields and either steady-state or oscillating fields, for the induced voltages to reach a state of equilibrium. These requirements prevent, or greatly complicate, the use of this technique with magnetic fields generated by the MRI system, and requires the addition of a dedicated set of coils to generate the required magnetic fields.

A different approach for remote sensing of location is disclosed by Pfeiler et al. (U.S. Pat. No. 5,042,486) and is further used by Ben-Haim for intra-body mapping (U.S. Pat. No. 5,391,199). Their technology is based on generating weak radio-frequency (RF) signals from three different transmitters, receiving the signals through an RF antenna inside the device, and calculating the distances from the transmitters, which define the spatial location of the device. As with the previous methodology, the application of the technology to MRI is problematic due to the simultaneous use of RF signals by the MR scanning. Potential difficulties are the heating of the receiving antenna in the device by the high amplitude excitation RF transmissions of the MRI scanner and artifacts in the MR image.

Dumoulin and colleagues disclose another approach to determine the location of a device, using a small receiving coil which is sensitive to near-neighborhood emitted RF signal during the MR imaging process (Dumoulin C L, Darro R D, Souza S P, "Magnetic resonance tracking", in Interventional MR, edited by Jolesz F A and Young I Y, Mosby, 1998; U.S. Pat. No. 5,318,025). Dumoulin and colleagues (U.S. Pat. No. 5,318,025) teach a tracking system based on induction of signals in receiving coils by the radio-frequency (RF) emission from the tissue near the device (Column 4, lines 33-50). It requires the use of all the components of an MRI scanner, including a high-intensity homogenous magnetic field, a set of three orthogonal magnetic gradient fields, RF transmission system, an RF receiving system, in addition to its own processing and controlling modules (FIG. 6 and Column 6, line 44 through Column 7, line 2). Since it is based on the same mechanism as that of image acquisition by MRI scanner, it can be viewed as imaging of a very small region of interest. Consequently, it requires the presence of material that can generate MR signals in the vicinity of the RF coils, either tissue (if the sensor is inside the body, like in catheters) or a small chamber of contrast agent (if tracking is done outside the body). Furthermore, the Dumoulin system requires substantial modification of the normal sequence of image acquisition to enable tracking (FIG. 4 and Column 4). This substantially complicates the programming of the pulse sequence of the scanner (due to the need to add RF and gradient activations for tracking that interfere with the imaging sequence), lengthens the time of scan, and limits the update rate of tracking. Additional major limitations of this tracking technique include the potential heating of the RF coils, especially inside the body; and the need to determine the orientation indirectly through the use of estimated location of at least 2 separate RF coils, with limited accuracy when small sensor must be used (i.e. when the distance between the two coils is short).

Interventional MRI: Many of the advantages of MRI that make it a powerful clinical imaging tool are also valuable during interventional procedures. The lack of ionizing radiation and the oblique and multi-planar imaging capabilities are particularly useful during invasive procedures. The absence of beam-hardening artifacts from bone allows complex approaches to anatomic regions that may be difficult or impossible with other imaging techniques such as conventional CT. Perhaps the greatest advantage of MRI is the superior soft-tissue contrast resolution, which allows early and sensitive detection of tissue changes during interventional procedures. Many experts now consider MRI to be one of the most powerful imaging techniques to guide interventional interstitial procedures, and in some cases even endovascular or endoluminal procedures (Yoshimi Anzai, Rex Hamilton, Shantanu Sinha, Antonio DeSalles, Keith Black, Robert Lufkin, "Interventional MRI for Head and Neck Cancer and Other Applications", Advances in Oncology, May 1995, Vol 11 No. 2). From the presented background on current methodologies, one can define the ideal system for minimal invasive procedures: It should provide real-time, 3-dimensional, non-ionizing imaging (like MRI or ultrasound) as feed-back to the user for optimal insertion and intervention; it should implement flexible, miniaturized devices which are remotely sensed to provide their location and orientation. By combining a composite image of the field of operation and the device location and orientation, the operator can navigate and manipulate the device without direct vision of the field of operation and the device. This may facilitate the use of minimal invasive intervention in the brain or other organs.

Motion artifacts in diagnostic MRI: Motion during scan hampers the image quality of MRI. The relative phase evolution of the MR signal induced as a result of the nuclear spin motion between the phase encode steps, presents as ghosting and smearing of signal intensity to incorrect locations in the image space (A. W. Anderson, J. C. Gore, "Analysis and correction of motion artifacts in diffusion weighted imaging," Magn. Reson. Med., vol. 32, pp. 379-387, 1994; R. J. Ordidge, J. A. Helpern, Z. X. Qing, R. A. Knight, and V. Nagesh, "Correction of motional artifacts in diffusion weighted MR images using navigator echoes," Magn. Reson. Med., vol. 12, pp. 455-460, 1994). Motion induced artifacts, specially the ghost and blurring artifacts, can significantly degrade the imaging sequences and also severely reduce the accuracy of functional MRI by deteriorating the weak activation signal. Retrospective motion correction techniques are currently used in routine MRI applications (M. Jenkinson, P. Bannister, J. M. Brady, S. M. Smith, "Improved optimization for the robust and accurate linear registration and motion correction of brain images," NeuroImage, vol. 17, pp. 825-841, 2002; D. Atkinson, D. L. G. Hill, P. N. R. Stoyle, P. E. Summers, S. Clare, R. Bowtell, and S. F. Keevil, "Automatic compensation of motion artifacts in MRI," Magn. Reson. Med., vol. 41, pp. 163-170, 1999; B. Kim, J. L. Boes, P. H. Bland, T. L. Chenevert, C. R. Meyer, "Motion correction in fMRI via registration of individual slices into an anatomical volume," Magn. Reson. Med., vol. 41, pp. 964-972, 1999; V. L. Morgan, D. R. Pickens, S. L. Hartmann, R. R. Price, "Comparison of functional MRI image realignment tools using a computer-generated phantom," Magn. Reson. Med., vol. 46, pp. 510-514, 2001; L. Freire, and J. F. Mangin, "Motion correction algorithms may create spurious brain activations in the absence of subject motion," Neuroimage, vol. 14, pp. 709-722, 2001). The realtime tracking of motion, for example by a tracking sensor that is attached to the moving organ, can be used prospectively during the scan to eliminate, or reduce, the effect of motion on the image quality.

MRI Pulse Sequence

A pulse sequence is a pre-selected set of defined radiofrequency (RF) and gradient pulses, usually repeated many times during a scan, wherein the time interval between pulses and the amplitude and shape of the gradient waveforms will control the MR signal reception and affect the characteristics of the MR images. Pulse sequences are specialized computer programs that control all hardware aspects of the MRI scan. Specific pulse sequences have been created to achieve various contrast mechanisms in the obtained images, and they are typically dependent on the magnetic field strength, the characteristics of the gradient fields, the characteristics of the RF fields, the type of imaging coil used, the clinical application of the sequence, and more.

Gradient Based Tracking

The EndoScout tracking system (Robin Medical, Baltimore, Md.) was developed to assist MRI-guided interventions in accordance with methods disclosed in U.S. Pat. No. 6,516,213, incorporated herein by reference in its entirety. The tracking is based on the gradient fields of the scanner. The system passively "listens" to the gradient activations and can track any device without the need to generate reference fields (as done by virtually all other electromagnetic tracking technologies). The EndoScout provides in real-time the position (location and orientation) of the device during MR scanning. This data enables the users to guide an interventional procedure to a target inside the body, using a minimally invasive approach. Devices and tools to be tracked may include: diagnostic devices (e.g. biopsy needles, aspiration needles), therapeutic devices (including devices used to destroy tissue, like RF ablation, laser ablation or cryo-therapy probes, or devices used to deliver therapeutic agents like drugs, chemotherapy agents, genetic vectors, stem cells, etc.) and various support tools (e.g. suction tips, pointers).

The main advantage of the gradient-based tracking technology is its independence of scanner type and mode of operation. However, some features of the pulse sequences may have adverse effects on the tracking performance and may result in less accurate or non-stable tracking. For example, the creation of 2-dimensional images requires encoding in two directions, which is achieved by frequency encoding and by phase encoding. The phase encoding typically involves gradient activations with variable amplitudes, beginning with a high positive amplitude, progressing through a low level and zero level amplitude, and ending with a high negative amplitude. During the time when gradient activations go through the low amplitude range, the tracking may be less accurate and create fluctuations in the tracking results that are in phase with the phase encoding of the scanning process. To eliminate this inaccuracy, the sampling window of the tracking system can be enlarged. To achieve maximal accuracy and stability, the sampling interval should include the whole length of the phase encoding cycle. While this can eliminate the accuracy problem, it may also result in low dynamic response of the tracking system, as typically large sampling windows are used, and the tracking results may be inaccurate if the tracked object is moving.

Another potential problem is the existence of eddy currents, which are induced when the gradient fields are changed over time, i.e. during activation and deactivation. These eddy currents are a well known phenomenon in MRI technology and are accounted for by the imaging process. The EndoScout tracking system uses maps that describe the spatial distribution of the gradient magnetic fields in each scanner where the system is used. These gradient field maps are measured during installation of the system. Eddy currents constitute a complex non-linear phenomenon that may depend on the specific gradient activation pattern in each moment, so eddy currents that affect the gradient field during mapping may differ from eddy currents that affect the gradient field during scan. Thus it may be difficult or even impossible to account for all types of eddy currents that are generated by various gradient combinations that are used during a scan.

OBJECTS AND SUMMARY OF THE INVENTION

An object of the present invention is to provide a novel method and apparatus for determining the instantaneous location and orientation of an object moving through a three-dimensional space, which method and apparatus have advantages in one or more of the above respects.

Another object of the present invention is to provide such a method and apparatus which is particularly useful in MRI systems by making use of a basic universal component of the MRI system, namely the time-varying magnetic gradients which are typically generated by a set of three orthogonal electromagnetic coils in such systems.

Another object of the present invention is to provide such a method and apparatus which is particularly useful in MRI systems by modifying the time pattern of gradient coil activations during scan to provide more data for the tracking system.

According to one aspect of the present invention, there is provided a method of determining the instantaneous location and orientation of an object moving through a three-dimensional space within the imaging space of a magnetic resonance imaging apparatus during operation of said magnetic resonance imaging apparatus. The method includes applying to the object a sensor for measurement of an instantaneous magnetic field within the imaging space of a magnetic resonance imaging apparatus, activating gradient coils of the magnetic resonance imaging apparatus during scanning operation of the magnetic resonance imaging apparatus so as to produce a magnetic field used for imaging, producing a tracking mode gradient activation signal at least one additional time point, the produced tracking mode gradient activation signal having command parameters for tracking of the object, resulting in a tracking mode activation of the gradient coils, measuring the instantaneous values of magnetic fields which are generated by the tracking mode activation of the gradient coils of the magnetic resonance imaging apparatus, identifying the command parameters of the tracking mode gradient activation signal, and processing the measured instantaneous values of the magnetic fields generated by the tracking mode activation, together with the identified command parameters, to compute the instantaneous location and orientation of the object within the space.

According to further features in embodiments of the present invention, the production of the tracking mode gradient activation signal may include bi-modally activating the gradient coils of the magnetic resonance imaging apparatus, wherein the bi-modal activation has a zero net effect on the imaging. According to additional features, identifying of the command parameters may include measuring of the command parameters, or retrieving stored information on the command parameters. The command parameters may include amplitude and rate of change of current flow of the tracking mode gradient activation signal.

According to further features in embodiments of the present invention, the method may further include measuring of instantaneous values of magnetic fields generated during the scanning operation and processing the measured instantaneous values of magnetic fields generated during the scanning operation together with the measured instantaneous values of the magnetic fields generated by the tracking mode gradient coil activation, to compute the instantaneous location and orientation of the object within the space.

According to further features in embodiments of the present invention, production of the tracking mode gradient activation signal may be done during a quiet section of a cycle of the scanning operation, during non-imaging time periods, resulting in a longer overall scan time; by adding activations of all three gradients for each phase encode step; by adding a single activation of a gradient for each phase encode step and toggling between the three gradients; or may be done only for gradient or gradients that use a gradient activation sequence with a variable amplitude in time for scanning. In some embodiments, a trigger signal may be used to define the time of production of the tracking mode gradient activation signal.

According to further features in embodiments of the present invention, the sensor for measurement of an instantaneous magnetic field within the imaging space of magnetic resonance imaging apparatus may comprise a coil assembly including a plurality of sensor coils having axes of known orientation with respect to each other and including components in the three orthogonal planes.

According to yet further features in embodiments of the present invention, the sensor may include sensor coils oriented in a known orientation, and the processing may include storing in memory reference magnetic field maps of each of the three gradient coils of the magnetic resonance imaging apparatus for the imaging space of the magnetic resonance imaging apparatus, and simultaneously estimating the location and the orientation of the sensor by processing the measured instantaneous values of the magnetic fields generated by the tracking mode gradient coils activation together with the known reference magnetic field maps of the gradient coils and the known relative orientation of the sensor coils.

According to yet further features, the processing may be effected by an iterative optimization process. This process may be effected in real time to determine the instantaneous location and orientation of the object in real time. In some embodiments, the produced tracking mode gradient activation signal is further used to determine position with an update rate faster than the rate of motion of the scanned object and use this position information to eliminate motion artifacts from the scanned images. The method may be used for diagnostic or interventional MRI, for example.

According to another aspect of the present invention, there is provided a system for determining the instantaneous location and orientation of an object moving through a three-dimensional space within the imaging space of a magnetic resonance imaging apparatus during operation of said magnetic resonance imaging apparatus. The system includes a magnetic resonance imaging apparatus having a set of activating gradient coils, and a gradient activation control unit for controlling activation of said activating gradient coils, a tracking portion including a sensor placed on the object for measurement of an instantaneous magnetic field within an imaging space of the magnetic resonance imaging apparatus, a tracking control unit for producing a tracking mode gradient activation signal and for identifying command parameters of the tracking mode gradient activation signal, and an electronic interface connecting the sensor and the tracking control unit. The system further includes a processor including means for producing a gradient activation scanning signal, and means for processing measured instantaneous values of the magnetic fields generated by the tracking mode activation of the gradient coils, together with the identified command parameters, to compute the instantaneous location and orientation of the object within the space.

According to further features in embodiments of the present invention, the sensor may include a coil assembly including at least three sensor coils oriented orthogonally with respect to each other. In some embodiments, the coil assembly may include three pairs of sensor coils, in which one sensor coil in each pair has the same orientation as the other sensor coil in the respective pair, and in which each pair of sensor coils has a different orientation from the other pairs of sensor coils. In some embodiments, each sensor includes a pair of sensor coils, wherein a first sensor coil in the pair is parallel to, but laterally spaced from, a second sensor coil of the pair. In some embodiments, the sensor includes a coil assembly including a cylindrical sensor coil and two pairs of sensor coils positioned orthogonally with respect to the cylindrical sensor coil. In some embodiments, the two pairs of sensor coils are curved and in a saddle relation to the cylindrical sensor coil. In some embodiments, the two sensors in a pair of sensor coils are planar. The sensor may be active sensor, such as a Hall-effect sensor, a passive sensor such as a coil sensor, or any other suitable sensor. In some embodiments, the object may be a medical instrument moving in the body of a person for medical diagnostic or treatment purposes.

According to further features in yet additional embodiments of the present invention, the system may further include a triggering mechanism for triggering of the tracking mode gradient activation signal. In some embodiments, the tracking mode gradient activation signal is a bi-modal signal.

The disclosed methodology and apparatus enable the estimation of the location and orientation of an object or a device by using a set of miniature, preferably (but not necessarily) orthogonal coils. The simplest embodiment has a set of three orthogonal coils. However more complex coil sets, for example a set of three orthogonal pairs of parallel coils, can improve the accuracy of the tracking with a higher cost of the system. To simplify the presentation, the following disclosure deals specifically with a set of three orthogonal coils, and also refers to the more complex configuration of three orthogonal pairs of coils. However the same concepts can be applied to various combinations of coils by anyone familiar with the field of the invention.

The time change of magnetic flux through a coil induces electromotive force (i.e. electric potential) across the coil (Faraday Law of induction). MRI scanners generate time-variable magnetic fields to create magnetic gradients in the scanned volume. By measuring the induced electric potentials in the three orthogonal coils (or pairs of coils), and by getting the time pattern of the generated magnetic gradients as input from the MRI scanner, both the location and orientation of the device can be estimated.

The present invention has significant advantages over existing methodologies. Compared with stereotaxis, either the frame or frameless techniques, the new methodology enables the use of devices like catheters or surgical instrumentation without the need for direct line of sight with the device and under realtime MRI. Unlike the remote electromagnetic localization methodology of Acker et al the present invention is based on measurement of voltages induced by a set of time-varying electromagnetic gradient fields in a set of coils (Faraday Law), rather than the need to use activations of homogenous electromagnetic fields and gradient electromagnetic fields which induce voltages in a set of miniature conductors carrying electrical current (Hall effect). Thus, the present invention is totally passive, it does not require any excitation of the sensors, and the requirement for time-variable magnetic fields may be satisfied with controlling the activation of the gradient coils through the pulse sequence of the scanner. The methods disclosed by Pfeiler et al and Dumoulin et al require the use of two sensors to measure orientations and thus have limited accuracy of orientation estimation, while the present invention uses a sensor which provides simultaneously accurate orientation and location tracking. Unlike existing optical tracking systems, there is no limitation on the number of sensors being used, and there is no need to maintain a line of sight between the sensor and the tracking apparatus. All other tracking methodologies are based on their own reference system, and should be aligned with the MRI coordinate system by a time-consuming registration procedure. The disclosed tracking methodology does not require registration since it uses the same set of gradient coils which are used by the MRI scanner for spatial encoding of the images.

BRIEF DESCRIPTION OF THE DRAWINGS

FIGS. 9A-9D are schematic illustrations of configurations of coil sets of three orthogonal coils or pairs of coils, in accordance with embodiments of the present invention, wherein FIG. 9A shows a cubic configuration for extra-corporeal applications with three orthogonal coils having a typical size of up to 10 mm, FIG. 9B shows a cubic configuration with 3 orthogonal pairs of parallel coils, FIG. 9C illustrates an axial (along the K axis) view of a cylindrical configuration for use with catheters, and FIG. 9D shows a 3-dimensional display of the sensor of FIG. 9C, having one cylindrical coil (22) and two pairs of transverse "saddle" coils (24, 26).

DETAILED DESCRIPTION OF THE INVENTION

Tracking based on the gradient fields of magnetic resonance imaging (MRI) scanners is disclosed in U.S. Pat. No. 6,516,213 by Nevo. This technology is based on passive operation of the tracking system without any change of the scanner's hardware or mode of operation. To achieve better tracking performance, a technique to create a custom MRI pulse sequence is disclosed. Through this technique any standard pulse sequence of the scanner can be modified to include gradient activations specifically designated for tracking. These tracking gradient activations are added in a way that does not affect the image quality of the native sequence. The scan time may remain the same as with the native sequence or longer due to the additional gradient activations. The tracking system itself can use all the gradient activations (gradient activations for imaging and gradient activations for tracking) or eliminate some of the gradients and lock onto the specific gradient activations that are added to the custom pulse sequence. The advantages of the proposed technique are: better tracking accuracy, better dynamic response of the tracking system, and lower sensitivity to eddy currents that are generated during the scan and modify the gradient fields of the scanner.

Figure 1:
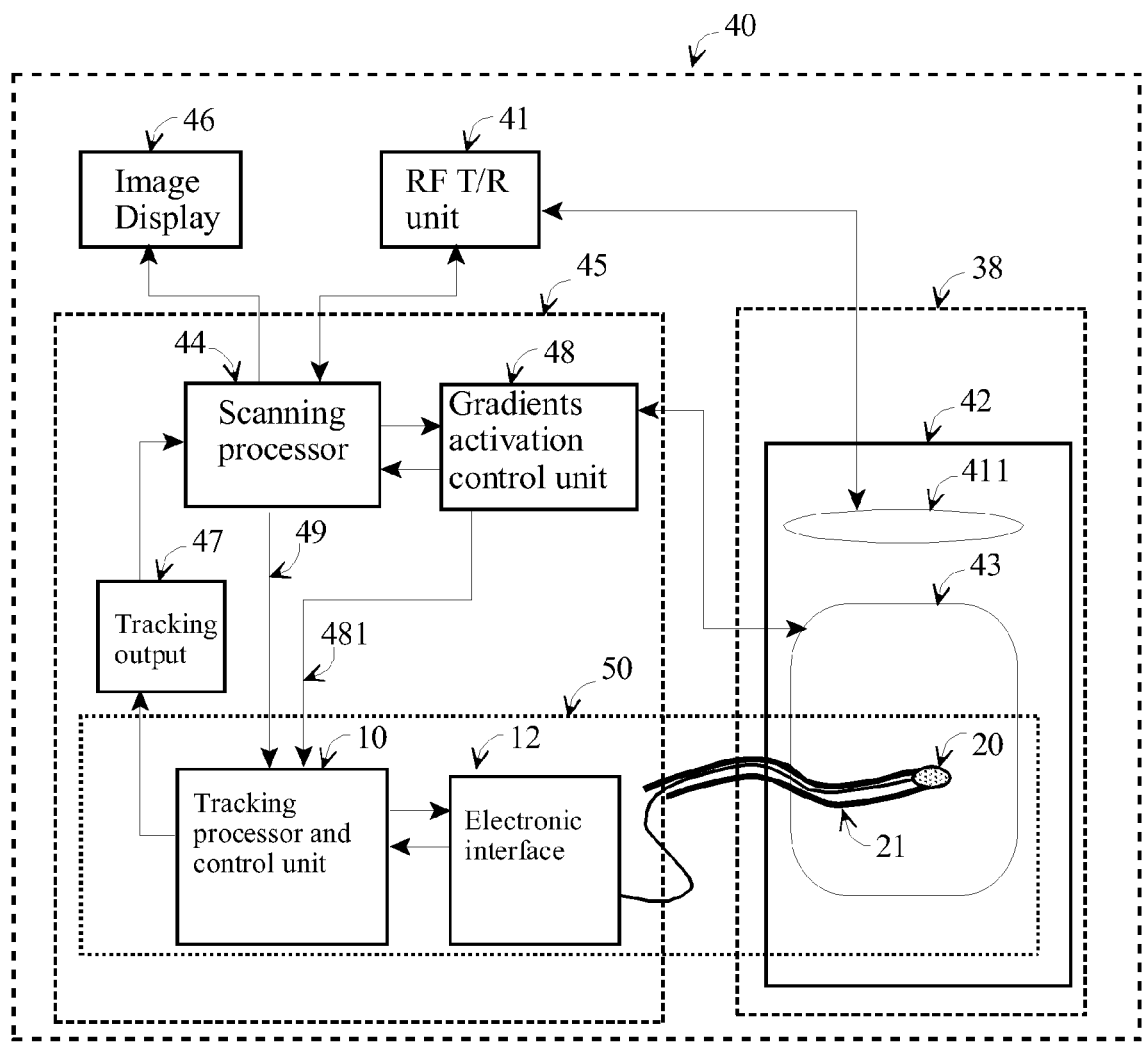
FIG. 1 is a block diagram illustration of an MRI system 40 in accordance with embodiments of the present invention, which includes a tracking processor and control unit 10, a sensor 20 integrated into or attached to an object or a device 21, an electronic interface 12 between the sensor 20 and the tracking processor and control unit 10, main magnet 42, radio-frequency (RF) transmit and receive unit 41, RF coils 411, three sets of gradient coils 43, a scanning processor 44, an image display 46, a trigger output 49, a gradient activation control unit 48, and a tracking output 47.

Reference is now made to FIG. 1, which is a block diagram illustration of a system 40, in accordance with embodiments of the present invention. System 40 is an MRI system having a scanning portion 38 and a processing and control portion 45. Scanning portion 38 includes main magnet 42, RF transmit and receive unit 41 and RF coils 411, and three gradient coils 43 positionable around a body to be scanned. Processing portion 45 includes a gradient activation control unit 48 for controlling activation of gradient coils 43 and for receiving data from gradient coils 43, a scanning processor 44 for sending commands to gradient activation control unit 48 to produce gradient activation scanning signals, for receiving data from measured magnetic fields generated by gradient coils 43, for controlling and receiving data from the RF module of the scanner 41, and for processing the received RF data to form a scanned image. In the present invention, scanning processor 44 is further configured for commanding gradient activation control unit 48 to produce additional signal commands to gradient coils 43 for the purpose of tracking an object 21 placed within the scanned body. These gradient activation tracking signals are produced at different times than gradient activation scanning signals. A tracking processor and control unit 10 is configured to receive data from an electronic interface 12 between tracking processor and control unit 10 and a sensor 20 placed on or in a vicinity of object 21, and to receive gradient activation data 481 from gradient control unit 48. In some embodiments, tracking processor and control unit 10 is incorporated into scanning processor 44. In other embodiments, tracking processor and control unit 10 is a separate component of processing portion 45. Electronic interface 12 is configured to condition signals that are generated by sensor 20 during activation of electromagnetic fields by the gradient coils 43. System 40 further includes an image display 46 for displaying a processed scanned image, and a tracking output 47 to display and to implement tracking information. In some embodiments, a trigger signal 49 is sent from scanning processor 44 to tracking processor and control unit 10 to indicate timing of production of gradient activation tracking signals.

Embodiments of the Tracking Apparatus

Figure 2:
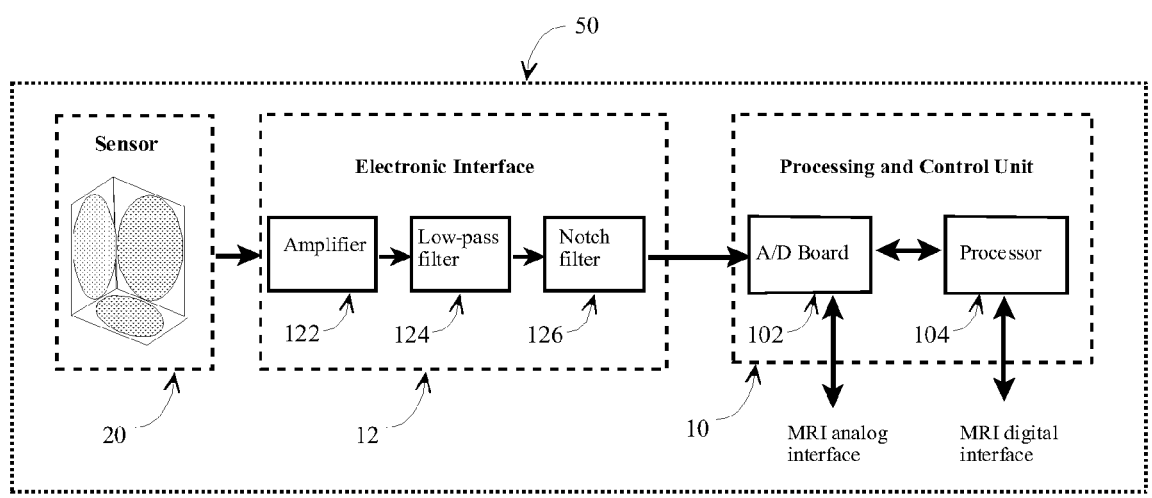
FIG. 2 is a block diagram illustration of a tracking portion 50 of system 40 of FIG. 1, in accordance with embodiments of the present invention, including a sensor 20, an electronic interface 12 and a tracking processor and control unit 10.

Reference is now made to FIG. 2, which is a block diagram illustration of a tracking portion 50 of system 40, in accordance with embodiments of the present invention. Tracking portion 50 includes sensor 20, electronic interface 12, and tracking processor and control unit 10, with an interface with the MRI scanner. It can be custom-designed and built for the specific tracking application or assembled from commercially available components.

The electronic interface 12 may include a set of amplifiers 122 to amplify the low-voltage potentials which are induced in a sensor that has induction coils (from millivolts level to volts), a set of low-pass filters 124 to eliminate the high frequency voltage potentials which are induced by the RF transmission, having frequency range of 10-400 MHz (depending on the MRI magnet strength), and stop-band or notch filters 126 to remove various potentials induced by various components of the MRI scanner, for example the cooling system of the superconducting main magnet or the step-wise increase of the MRI gradients, which in a General Electric MRI scanner produce a 128 KHz artifact in the tracking sensors. Various commercial systems with programmable amplifier\filter combinations can be used to amplify and filter the low-voltage signals from the sensors. For example, a cascade of commercial amplifiers (e.g. PGA103 programmable gain operational amplifier and PGA205 programmable gain instrumentation amplifier by BURR-BROWN) may be used to condition the sensor signals.

Tracking processor and control unit 10 can be developed using readily available commercial hardware. For example, the measured signals from the sensor can be digitized by analog-to-digital (A/D) converter 102 using a standard data acquisition board (e.g. National Instruments, Austin, Tex.), and processed in real-time by a modern, high performance processor 104 (e.g. a Pentium processor by Intel Corporation). Another potential solution, which provides faster estimation rates, can be based on digital signal processor (DSP) boards, having built-in or attached A/D converter having at least 6 channels (3 coil signals and 3 MRI gradient signals), high-performance DSP for iterative solution of location and orientation, sufficient memory capacity for the program and for data (e.g. the reference magnetic fields), and communication bus for interface with the host computer or directly with the MRI scanner (e.g. Blacktip-CPCI processing board and BITSI-DAQ analog input/output adapter, Bittware Research Systems, Concord, N.H.). The software for the DSP or the PC processor can be developed with standard programming languages, for example C++ or assembly. In some embodiments, Matlab software development environment (The Math Works, Natick, Mass.) may be used to rapidly implement the estimation process as described above, followed by translation of the program into C-language to achieve faster program execution.

The interface with the MRI can have various configurations. In the disclosure of U.S. Pat. No. 6,516,213 the interface includes two main components—a channel to transfer the real-time location and orientation of the sensor, and a channel (or channels) to transfer the activation pattern of the gradient coils from the MRI scanner to the processing module. Either digital communication channels, analog channels, or a combination of the two can be used. With the Signa MRI scanner (GE Healthcare), for example, the gradient activation sequence is available as standard analog output from the gradient control system, and tracking information can be received by the MRI scanner through a standard serial communication or Ethernet line. In another embodiment an additional channel is used to acquire the triggering signal from the scanner, which is typically available through standard output connections on the scanner. When repetitive gradient activations for tracking are used, a third configuration can be used, in which only the trigger signal is needed to be acquired from the scanner's hardware, for example with an optically isolated line or through digital communication.

Figure 3:
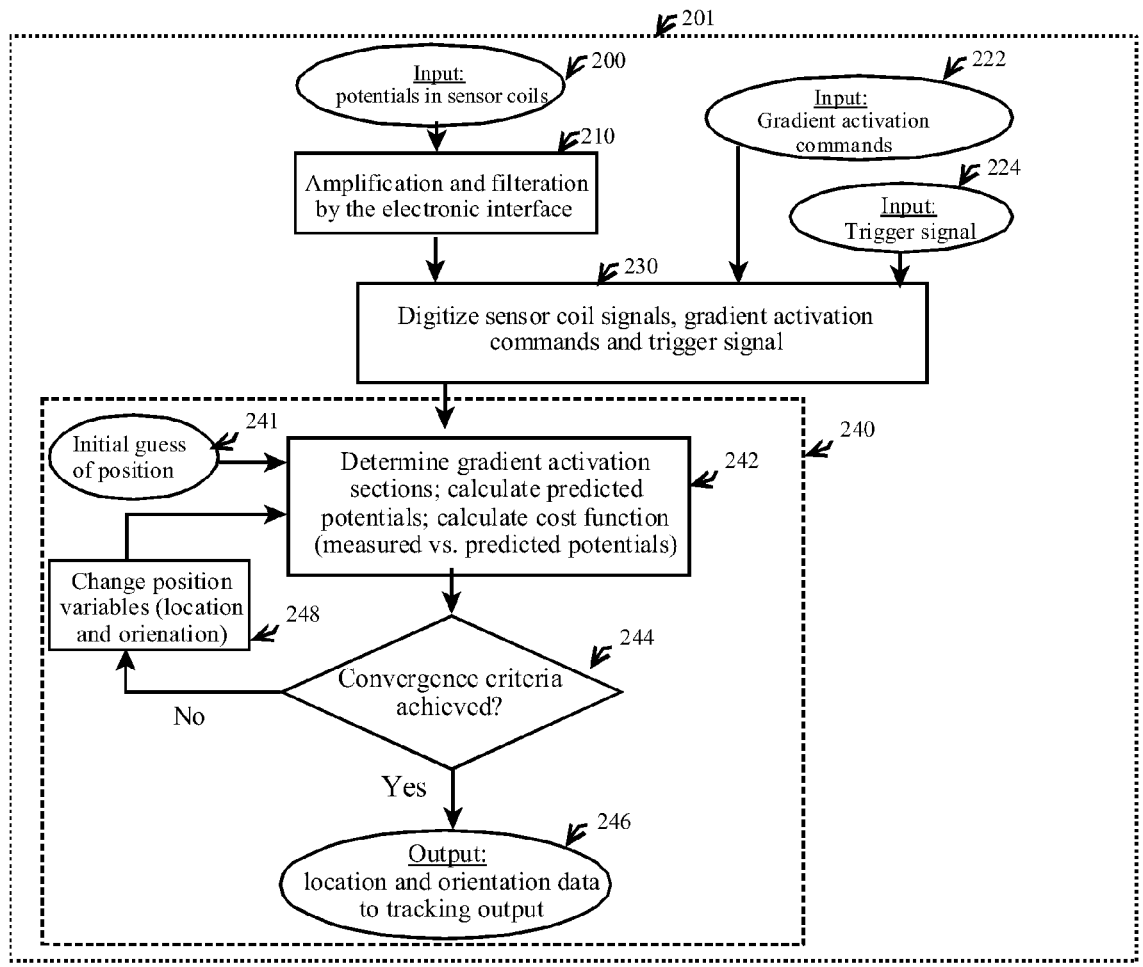
FIG. 3 is a flow chart illustration of a method of tracking for various clinical uses, in accordance with embodiments of the present invention.

Reference is now made to FIG. 3, which is a flow-chart illustration of a method 201 of tracking for various clinical uses, in accordance with embodiments of the present invention. Method 201 may be performed using system 40 of FIG. 1, or any other suitable system. First, sensor 20 is applied to an object to be tracked. Sensor 20 is configured to measure an instantaneous magnetic field within the imaging space of the MRI apparatus. The signals generated in sensor 20, which are typically electrical potentials induced in passive coils, as will be described below, typically having a magnitude of millivolts, are induced (step 200), and then amplified and filtered (step 210) by the electronic interface module 12. Inducing (step 200) of electrical potentials within sensor 20 is done by activating gradient coils to produce a tracking mode gradient activation signal. The tracking mode gradient activation signal pattern is implemented by inputting (step 222) the activation command to the gradient activation control unit 48 and optionally inputting (step 224) a trigger signal 49 into tracking processor and control unit 10. The scanning processor 44 inputs (step 222) the activation command into the gradient activation control 48, thus activating the gradient coils 43 of the MRI system 40 and resulting in a tracking mode activation of the gradient coils. The tracking mode gradient activation signal has certain command parameters, which may include amplitude and rate of change of current flow of the tracking mode gradient activation signal, or other relevant parameters. These command parameters and signals are filtered or otherwise processed by gradient activation control unit 48 and are acquired (step 230) by the tracking processor and control unit 10. Two types of command parameters may be used: a customized sequence with tracking activations for tracking marked by a trigger signal; or a trigger-only interface with a known gradient activation pattern which is stored and then retrieved upon implementation (a repetitive gradient activation mode). Once an activation of any gradient coil is detected, the tracking processor and control unit 10 digitizes the signal from the sensor coils, through the electronic interface 12, to determine the level of the induced signals. When only the trigger signal is available, as in the repetitive gradient activation mode, the tracking system has a set of time delays between the trigger onset time and the gradient activations times, so the coil signals can be digitized at the appropriate times.

Tracking processor and control unit 10 uses the measured instantaneous values of the magnetic fields generated by the tracking mode gradient coil activation, together with identified command parameters 481, to compute the instantaneous location and orientation of the object within the space. This computation may be done as follows.

The sensor position may be estimated (step 240) by tracking processor and control unit 10 via an iterative process. First, an initial estimate is made (step 241) of predicted electrical potentials that are calculated from the known gradient field amplitude, the geometry of the sensor and its coils, and current values of sensor position variables. The measured electrical potentials are compared (step 242) with the estimated values. If convergence criteria are achieved (step 244), the resulting position variables (location and orientation) are transferred (step 246) to tracking output 47. If convergence is not achieved, the position variables are updated (step 248) and the process is repeated. In this way, improved values may be achieved in consecutive iterations of the process.

The estimated location and orientation may be further processed to improve the quality of the tracking, e.g. by the application of a low-pass digital filter on the estimations at a specific time, using previous estimations, and may be transformed into a data format which is required by the MRI scanner.

In some embodiments, the instantaneous magnetic fields generated by normal scanning are also used in the tracking calculation.

The exact implementation of the invented methodology depends on the MRI mode of imaging, and the following description relates to any standard or modified MRI sequence. During MRI scan, repeated generation of magnetic fields by the three gradient coils provides the spatial encoding of the received MR echo and enables the reconstruction of the image. A sample sequence is given in FIG. 5, top plot (recorded from a Trio MRI scanner, Siemens Medical Solutions, USA).

As described in U.S. Pat. No. 6,516,213 to Nevo, the gradient coil activations may by themselves provide the required data to estimate the location and orientation of the sensor. The estimation process is based on minimization of the difference between measured and predicted sensor signals. This can be done by various minimization methods, for example the minimization of the sum of squares of the differences between the measured and predicted signals (the least squares method). The measured signals in the sensor coils are linearly related to the time derivative of the magnetic flux through each coil (Faraday Law of Induction). Thus the measured signals can be compared with reference signals that are calculated from the known distribution of the gradient fields in the scanner, the known pattern of gradient activation, and the known geometry of the tracking sensor, as detailed below.

The gradient activation control unit 48 provides the tracking processor and control unit (10) with the activation commands of the three gradient coils which generate the three magnetic gradient fields Gx, Gy, Gz in the scanner. A full description of the magnetic field as function of time and location with any mode of operation (G(t,x,y,z)) can be calculated within the tracking processor and control unit (10) by vectorial summation of the three time-variable magnetic fields of the three gradient coils and the time-invariant main field (Bo) of the MRI scanner (in the following description vectors are underlined, to distinguish from scalars):

$$\underline{G}(t,x,y,z)=\underline{Gx}(t,x,y,z)+\underline{Gy}(t,x,y,z)+\underline{Gz}(t,x,y,z)+\underline{Bo}(x,y,z) \quad (1)$$

where x,y,z are coordinates along the three axes of the MRI coordinate system (X, Y, Z, respectively) and t is a time variable. Additional magnetic fields, which are generated by the RF (radio frequency) coils of the MRI, are not used for the method of estimating location and orientation of the current invention. These fields, which in clinical scanners alternate in the range of tens of mega-hertz, induce high-frequency electrical potentials in the sensing coils which can be removed by low-pass filtration.

The magnetic field that is generated during the activation of the gradient coils of the scanner can be calculated from the gradient field maps that are generated by simulation or are measured during the installation of the tracking system by using standard methods to measure magnetic fields. These maps can be stored in various formats, for example as a set of values for a 3-dimensional grid, or as 3-dimensional functions of locations X,Y,Z in the MRI imaging volume. The command signal of the gradient coil represents the time change of the amplitude of the gradient, so the gradient field as a function of time and location G(t,x,y,z) can be represented by multiplication of the gradient field by the normalized gradient command signal.

Figure 4:
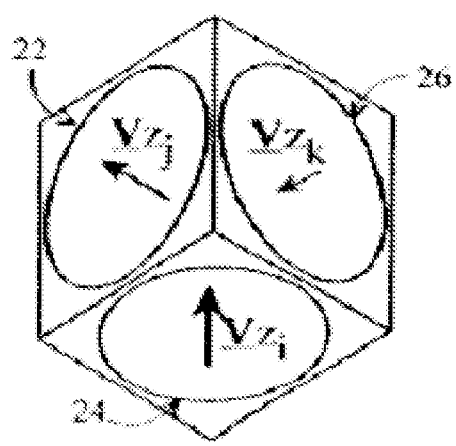
FIG. 4 is a schematic illustration showing the configuration of three orthogonal coils (22, 24, 26) in the sensor 20 and the induced electrical potential in each coil.

In one embodiment, as shown in FIG. 4, the sensor 20 includes a set of three orthogonal sensing coils (22, 24, 26). The time varying magnetic field $\underline{G}(t,x,y,z)$ induces electric potential in each of the sensing coils, and the magnitude of the induced potentials is related to the time-derivative of the magnetic flux Θ through the coil, as given by the Faraday Law of Induction:

$$V=-d\Theta/dt \quad (2)$$

The magnetic flux through each coil in the sensor is determined by the magnetic field amplitude at the location of the coil, denoted by $\underline{G}(t,x,y,z)$, the coil area (A), and the angle between the gradient field vector and the orientation of the coil, as defined by a unit direction vector n vertical to the plane of the coil:

$$\underline{\Theta}(t,x,y,z)=\underline{G}(t,x,y,z)\cdot\underline{n}A \quad (3)$$

where the · denotes a vectorial dot product. The typical coil has multiple wire turns to increase its inductivity, so the area A represents the total induction area of the coil.

By using equations 1-3, one can predict the induced electrical potential Vp in each coil from the time derivative of the magnetic field:

$$Vp=-d[(\underline{Gx}(t,x,y,z)+\underline{Gy}(t,x,y,z)+\underline{Gz}(t,x,y,z)+\underline{Bo}(x,y,z)) X\underline{n}A]/dt \quad (4)$$

If the sensor does not move or rotate, the Bo field and the direction vector $\underline{n}$ are constant and the predicted electrical potential in the coil is given by:

$$Vp=-d[(\underline{Gx}(t,x,y,z)+\underline{Gy}(t,x,y,z)+\underline{Gz}(t,x,y,z))]/dtX\underline{n}A \quad (5)$$

The Iterative Estimation of Location and Orientation

In order to predict the induced potential in each coil, the location and orientation of the coil should be given. Thus, when the estimation process is started, an initial guess of the location and orientation of the sensor is given by three position variables (e.g. the sensor coordinates in the Cartesian coordinate system of the scanner $x_s,y_s,z_s$) and three orientation variables (e.g. the three Euler angles $\{\Psi, \Phi, \theta\}$). The position of coil n is given in the local Cartesian coordinate system of the sensor IJK as 3 coordinates $i_n,j_n,k_n$.

The position of coil n in the MRI coordinate system $\{x_n, y_n, z_n\}$ is given by vector summation of the vector location of the sensor in the XYZ coordinate system $\{x_s,y_s,z_s\}$ and the vector location of the coil in the IJK coordinate system $\{i_n, j_n, k_n\}$ after transformation to the MRI coordinate system by the transformation matrix R:

$$\begin{vmatrix} x_n \\ y_n \\ z_n \end{vmatrix} = \begin{vmatrix} x_s \\ y_s \\ z_s \end{vmatrix} + R \cdot \begin{vmatrix} i_n \\ j_n \\ k_n \end{vmatrix} \quad (6)$$

The transformation matrix R is derived from the Euler angles of the sensor orientation:

$$R = \begin{vmatrix} r_{11} & r_{12} & r_{13} \\ r_{21} & r_{22} & r_{23} \\ r_{31} & r_{32} & r_{33} \end{vmatrix}$$

and $r11=\cos(\Psi)*\cos(\Phi)-\cos(\theta)*\sin(\Phi)*\sin(\Psi);$ $r12=\cos(\Psi)*\sin(\Phi)+\cos(\theta)*\cos(\Phi)*\sin(\Psi);$ $r13=\sin(\Psi)*\sin(\theta);$ $r21=-\sin(\Psi)*\cos(\Phi)-\cos(\theta)*\sin(\Phi)*\cos(\Psi);$ $r22=-\sin(\Psi)*\sin(\Phi)+\cos(\theta)*\cos(\Phi)*\cos(\Psi);$ $r23=\cos(\Psi)*\sin(\theta);$ $r31=\sin(\theta)*\sin(\Phi);$ $r32=-\sin(\theta)*\cos(\Phi);$ $r33=\cos(\theta);$ The orientation of the coil in the MRI coordinate system is given by a transformation of the coil direction vector from the sensor coordinate system to the MRI coordinate system:

$$\underline{n}_{XYZ}=R\cdot\underline{n}_{IJK} \quad (7)$$

Once the location and orientation of the coil in the coordinate system of the MRI is determined, the predicted electrical potential on the coil can be calculated by equation 5. The actual electrical potential that is induced in the coil may be amplified by the signal conditioning system, so appropriate calibration is applied on the measured signals to yield the level of the measured electrical potential Vm.

The differences between the measured and predicted electrical potentials on all the sensor coils during the activation of the three gradient fields are used to calculate the cost function. For example, if gradient activation for tracking is used, the three gradient coils can be activated separately, and for each gradient activation, three pairs of predicted\measured induced coil potentials are determined. New values for the sensor location and orientation can be calculated by using a well established minimization procedure (e.g. the Levenberg-Marquardt search algorithm).

In the description above the cost function is based on nine different measurements (three sensor coils during the activation of three different gradient fields) and can be used to estimate the six unknown location and orientation parameters. When a six-coil sensor is used, the cost function is based on eighteen different measurements, which can improve the tracking accuracy by reducing the effect of noise. When the iterative process achieves the correct location and orientation of the sensor, the differences between the measured and predicted potentials will become small and the cost function will reach its minimal level (it will not reach the zero level due to various inaccuracies—for example inaccuracy in the geometry of the sensor, noise in the measured signals, inaccuracy in the gradient field maps, inaccuracy in the calibration of the signal conditioning system, etc.). The iterative process is stopped when the cost function achieves a small enough value, or the level of reduction of the cost function becomes too small, and the final set of coordinates is transferred from the tracking system to the MRI scanner as an updated location of the tracking sensor.

Adaptation of the Scanner's Pulse Sequence for Gradient-based Tracking

Figure 5:
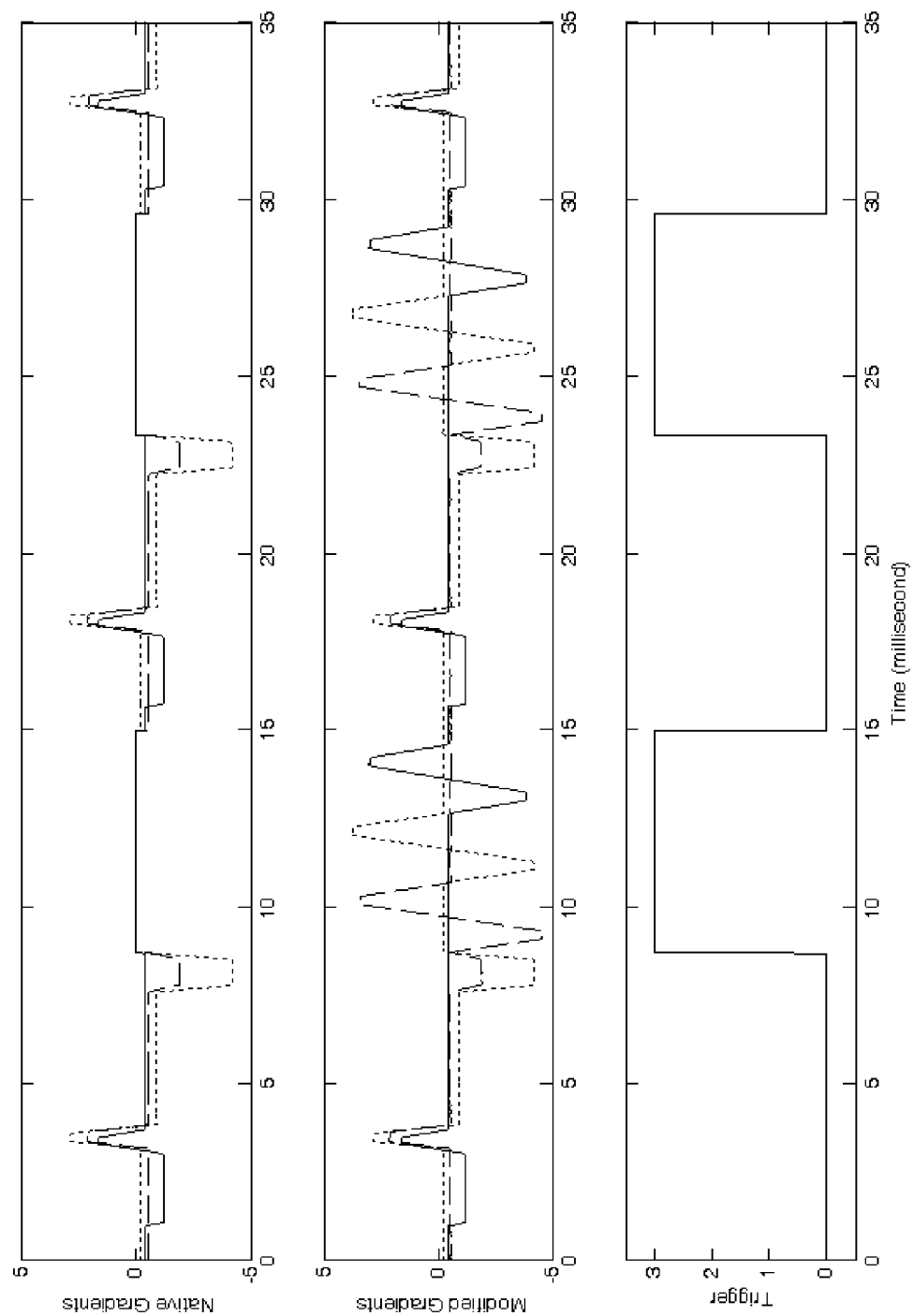
FIG. 5 is a series of graphical illustrations of a standard activation sequence of the MRI gradient coils for imaging as a function of time (top plot), a modified sequence with additional gradient activations for tracking (middle plot) interspersed over time in between the standard activation events, and additional gradient activations for tracking marked by a trigger signal (bottom plot)

Reference is now made to FIG. 5, which is a series of graphical illustrations of a standard activation sequence of the MRI gradient coils for imaging as a function of time (top plot), a modified sequence with additional gradient activations for tracking (middle plot) interspersed over time in between the standard activation events, and additional gradient activations for tracking marked by a trigger signal (bottom plot);

To achieve high quality tracking, the gradient-based tracking system as disclosed in U.S. Pat. No. 6,516,213 requires sufficient and independent activation of each of the three gradient fields of a standard MRI scanner. Each specific mode of operation of the scanner has a pulse sequence design (PSD) to achieve optimal images with specific requirements such as size, resolution, contrast, level of sensitivity to flow, etc. In the present invention, the method includes modification of the PSD by adding gradient activations for tracking. The added gradient activations may be used by themselves or in combination with the standard gradient activations. The advantages of this method are increased update rate of tracking and higher accuracy of tracking. Instead of only receiving tracking information during a regular scan, which may require tens of milliseconds or more, in the present method tracking information can be obtained every few milliseconds or even more frequently, by inserting additional specific gradient activations for tracking. This can be done for any standard PSD and may be accomplished in various ways.

In one embodiment, consecutive gradient activations of the three gradients that have zero net effect on the sample are added. This can be achieved by bi-modal gradient activations, where the negative activations null the effect of the earlier positive gradient activations (FIG. 5, middle plot). In many PSDs there are "quiet" sections within each cycle of the sequence where no RF nor gradient activations occur, for example when a relatively long repetition time (TR) is used. During these "quiet" sections, a packet of gradient activations for tracking (for example, three consecutive X,Y,Z gradient activations) can be added so the duration of the cycle, and consequently the duration of the scan, do not change. However, in PSDs that do not have sufficiently long "quiet" sections like this, there may be a need to add non-imaging sections that are dedicated to tracking, which will result in longer overall scan time.

In another embodiment, a single activation of one gradient is added for each phase encode step, and one can then toggle between the three gradients. Thus, within three phase encode steps, all three gradients are activated for tracking.

In another embodiment, only one or two gradient activations are added. In some scan modes two gradients are maintained with constant activation, while one gradient that serves as the phase encode gradient has variable amplitude in time. Thus, gradient activations for tracking can be added only to the variable phase encode gradient.

In yet another embodiment, a random phase encode is used for scanning. In this case the amplitude of the phase encode gradient is modified randomly, so there is no section with only low amplitudes.

Tracking with the Added Gradient Activations

When tracking is based on the additional gradient activations that are dedicated for tracking, as in the present invention, the scanner can be programmed to send a trigger signal to the tracking system. This trigger signal activation can be programmed as part of the pulse sequence to be activated during the time of gradient activations for tracking (FIG. 5, bottom plot). The tracking system can use either continuous sampling of the gradient signals, as disclosed in U.S. Pat. No. 6,516,213, or triggered sampling of the packet of gradient activations for tracking. If continuous sampling is used, the tracking system can use all the gradient activations during the scan, or numerically search for some of the gradient activations that should be used for tracking, for example the added gradient activations for tracking. Use of only the added gradient activations may reduce the effect of eddy currents. In particular, once a specific pattern of gradient activations is added to the pulse sequence of the scan, the same specific pattern can be used during the mapping process. This will reduce or even eliminate the effect of eddy current on the tracking, as the same eddy currents will be present during the mapping activation (the reference gradient maps) and during the tracking activation for tracking. If the trigger signal from the scanner is available, the tracking system can acquire the gradient command signals only when the gradient activations for tracking are used. This may simplify the operation of the tracking system and may result in a more reliable tracking system.

Independent activation of all three gradients may enable accurate determination of the location and orientation by the gradient-based tracking system. The typical time needed for single gradient activation on a standard high-field scanner (e.g. 1.5 T scanner) can be less than 0.5 msec, and a full packet duration can thus be less than 1-2 msec. Sufficient update rate for the tracking system depends on the application. Surgical intervention can be guided with an update rate of a few hertz (e.g. 4 Hz on the Signa-SP surgical scanner, GE Healthcare); motion artifact elimination requires a rate of at least 25 Hz or more, to enable tracking of physiological tremor with a frequency contents of up to 12 Hz (Deuschl G, Elble R J. The pathophysiology of essential tremor. Neurology 2000; 54:S14-20; Elble R J. Origins of tremor. Lancet 2000; 355: 1113-4); catheterization may require the fastest tracking rate to compensate for cardiac motion, with frequency content that may reach 50 Hz (Schmidt E J, Dumoulin C, Hayase M, Brady T J. Coronary Artery Motion Tracking in Swine Models with MR Tracking American Heart Association Meeting, Orlando, Fla., Nov. 9-12, 2003). For these different applications, the time occupied by the tracking gradient activations will be less than 1% for surgical applications (5 activations of 2 msec, totaling 10 msec per second), about 5% for motion artifact elimination (25 activations of 2 msec per second), and about 10% of the scan time for cardiac applications (50 activations of 1-2 msec per second).

Tracking with Repetitive Gradient Activations for Tracking

Since the gradient activations for tracking can be accurately repeated at different times during the scan, a simpler hardware setup can be used by acquiring only the trigger signal and not the gradient command signals, as is typically used by the tracking system. Once the relation between the time of the trigger and the time of each gradient activation for tracking is determined and maintained throughout the scan, and the pattern of gradient activation for tracking is known and does not change with time, one can avoid the acquisition of the gradient signals. Thus, once a trigger signal is identified, the time of gradient activations can be determined by using the fixed delay between the trigger and the gradient activation (FIG. 5, middle and bottom plots). At the time of gradient activation, as determined by using the trigger signal, the tracking system acquires the sensor signals.

Figure 6:
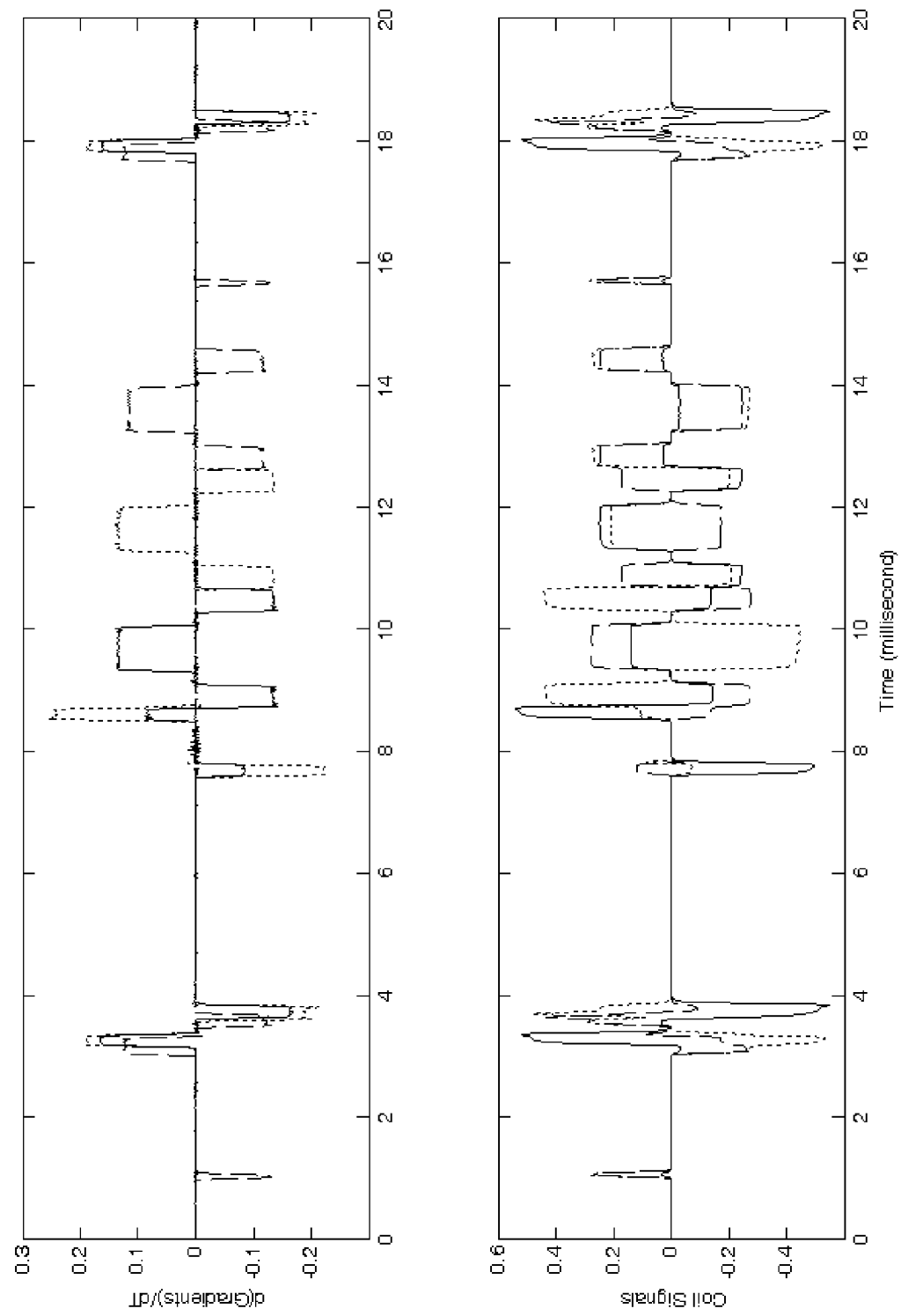
FIG. 6 is a graphical illustration of the time-derivative of the command signals of the MRI gradient coils (top plot) as functions of time, and voltages induced by the time-varying magnetic fields of the MRI gradient coils (those presented in the top plot) in two orthogonal sensing coils (e.g. 22, 24) as functions of time (bottom plot)

Reference is now made to FIG. 6, which is a graphical illustration of the time-derivative of the command signals of the MRI gradient coils (the same command signals that are presented in FIG. 5, middle plot) as functions of time (top plot), and voltages induced by the time-varying magnetic fields of the MRI gradient coils (those presented in the top plot) in two orthogonal sensing coils (e.g. 22, 24) as functions of time (bottom plot).

Figure 7:
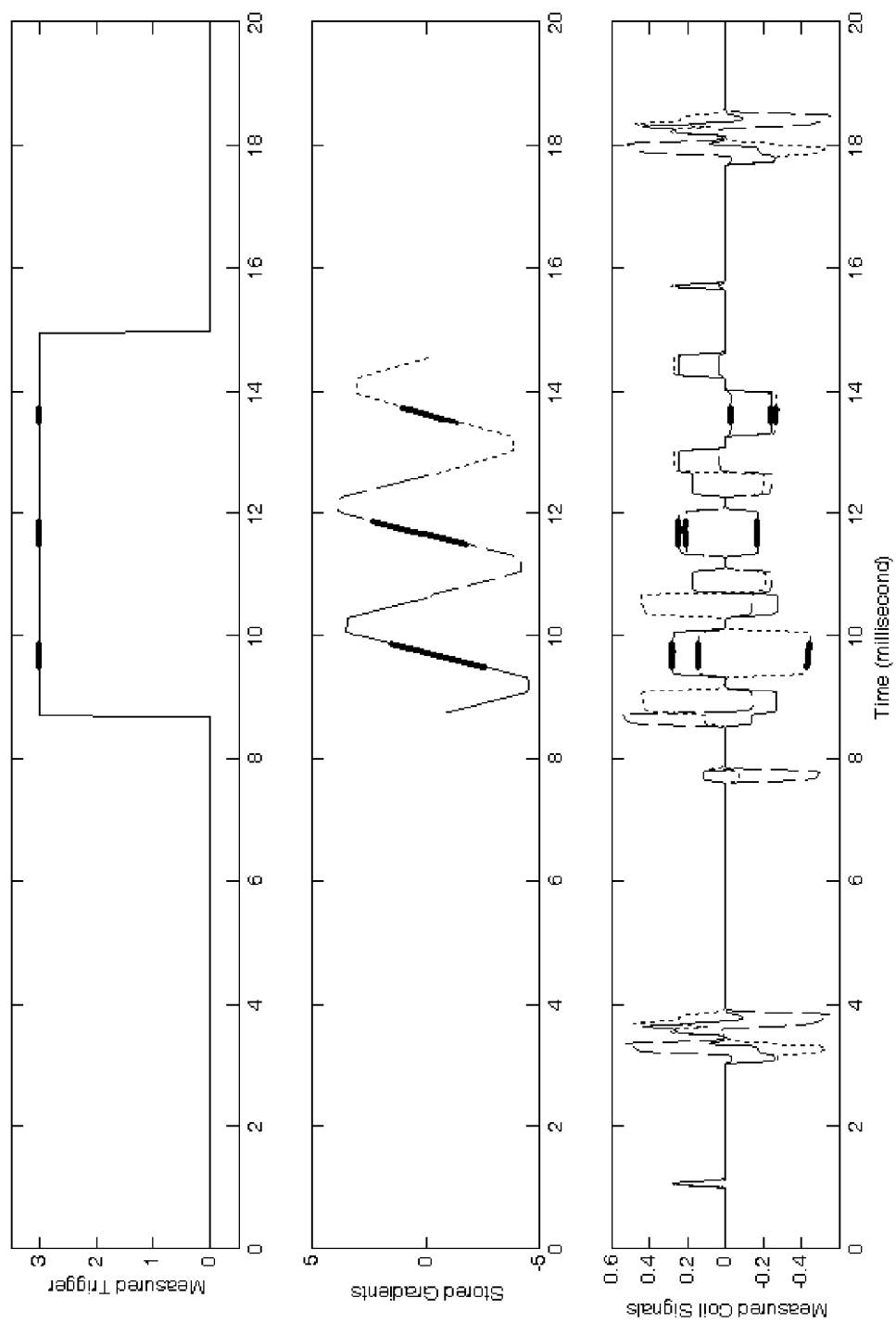
FIG. 7 is a graphical illustration of the signals used by the tracking system when only a trigger signal (top plot) is acquired to mark gradient activations that are used for tracking. The required data for tracking is acquired from the coil signals (bottom plot) and from stored, a-priori known patterns of the gradient activations (middle plot)

Rather than using acquired gradient signals for tracking, as described above with reference to FIGS. 5 and 6, the system may use the acquired sensor signals and a-priori known values of the gradient signals to calculate the position and orientation of the sensor. This embodiment is presented in FIG. 7, which is a graphical illustration of the signals used by the tracking system when only a trigger signal (top plot) is acquired to mark gradient activations that are used for tracking. The required data for tracking is acquired from the coil signals (bottom plot) and from stored, a-priori known patterns of the gradient activations (middle plot). In this embodiment, the gradients are activated for tracking during each phase encode step of the scan, and the trigger signal (top plot) is initiated concurrently with the first activation of the gradient for tracking. The time delay between the trigger onset and the specific times when data are collected during gradient activations (during upslope and down-slope of the gradients, middle plot) is known, so data collection from the sensor signals (bottom plot) can be done at the appropriate times. The elimination of the need to acquire gradient signals from the scanner greatly simplifies the interface to the scanner. The gradient commands are analog signals and typically require a conductive interface with the scanner, which can induce noise interference (for example due to ground loops). The trigger signal is a logical signal that can be acquired through an optically isolated line, which eliminates any possibility of interference between the scanner and the tracking system.

The Effect of Voltages Induced by the Bo Field when the Sensor Moves or Rotates

Figure 8:
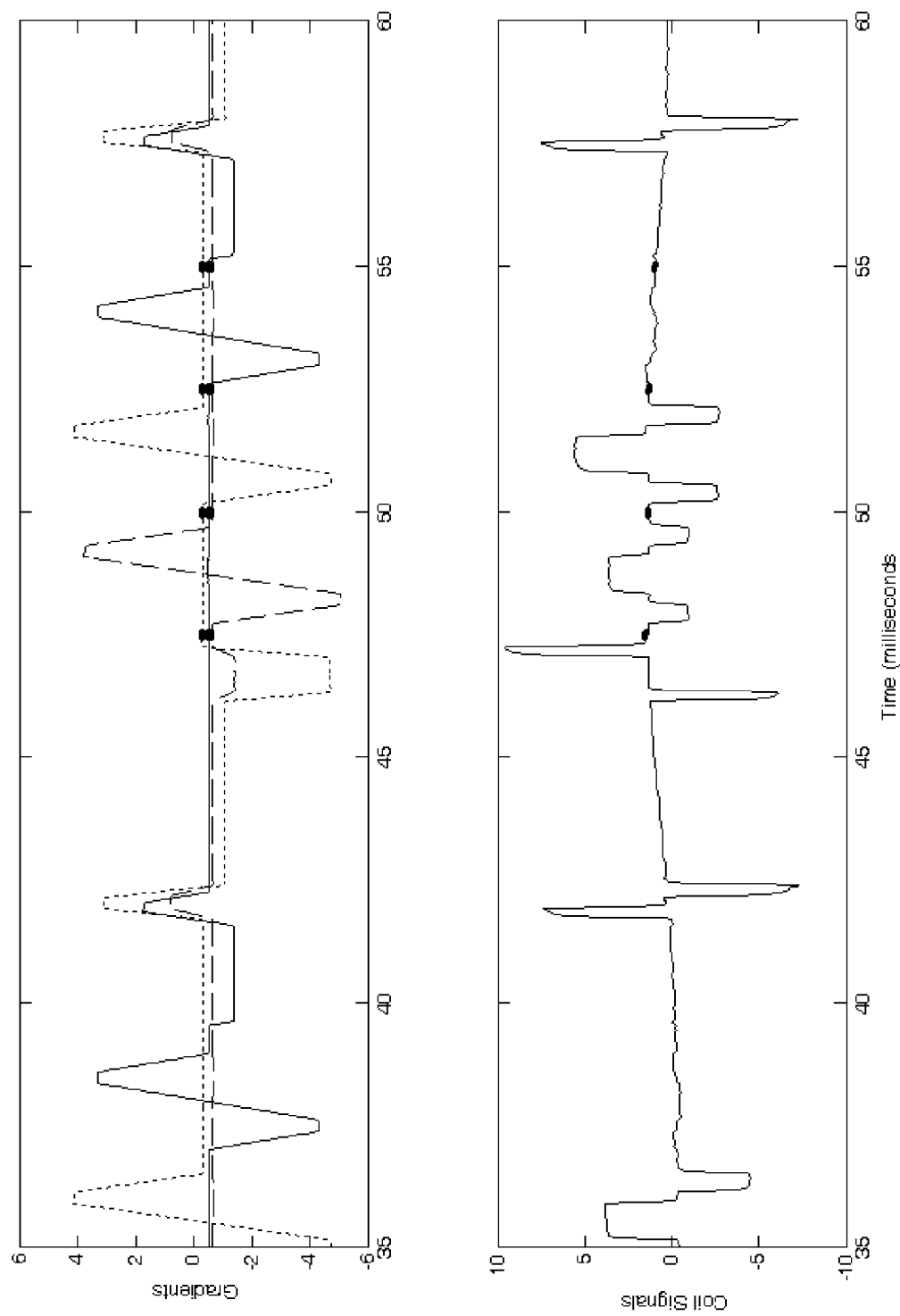
FIG. 8 is a graphical illustration of the sensor signal during rotation of the sensor with respect to the constant main magnetic field of the scanner. The rotation results in the induction of an electrical potential that appears as baseline wander.

Reference is now made to FIG. 8, which is a graphical illustration of the sensor signal during rotation of the sensor with respect to the constant main magnetic field of the scanner. The rotation results in the induction of an electrical potential that appears as baseline wander.

Equation 4 provides the general description for the induced voltages in the sensor coils, but the description above assumes no effect of the Bo field. This assumption is correct as long as the sensor does not move, or when the movements are relatively slow. Since the typical rise time of gradients in modern MRI system is less than 1 millisecond (FIG. 5), and body or device movements are typically slower (in scale of seconds or tenth of a second), the effect of the Bo can be eliminated by appropriate high pass filtering of the signals from the sensor coils (for example a 100 Hz cut-off frequency), and the description above can be applied to the filtered signals during movements and rotations of the body organs (e.g. the head) or the device.

When gradient activations for tracking are used, the effect of Bo on the signals can be eliminated in a more robust way. Since the Bo is constant, it induces electric potential in the sensor coils only when there is rotation of the coils which changes the magnetic flux through the coils. Unlike equation 3 above, the time varying variable now is the direction of the coils which is given by a time variable unit vector $\underline{n}(t)$:

$$\Theta = \underline{G} \cdot \underline{n}(t) A \quad (8)$$

The induced electrical potential is continuous, it is not affected by the gradient activations for tracking, and it appears in the coil signals as a wandering baseline (FIG. 8, bottom plot). Thus, the coil signals can be sampled shortly before and after the gradient activation to determine and to eliminate the baseline shift during the gradient activation (marked sections in FIG. 8).

Embodiments of the Sensor

One embodiment of the sensor includes a configuration of three coils. Another embodiment includes a configuration of two coils, using the same approach as presented above, and using the 6 potentials induced by the three MRI gradients in the two coils to calculate the 6 unknowns (3 locations and 3 rotation angles). However, for optimal performance more data should be used to reduce the effects of noise and to improve the accuracy of the tracking.

Figure 9:
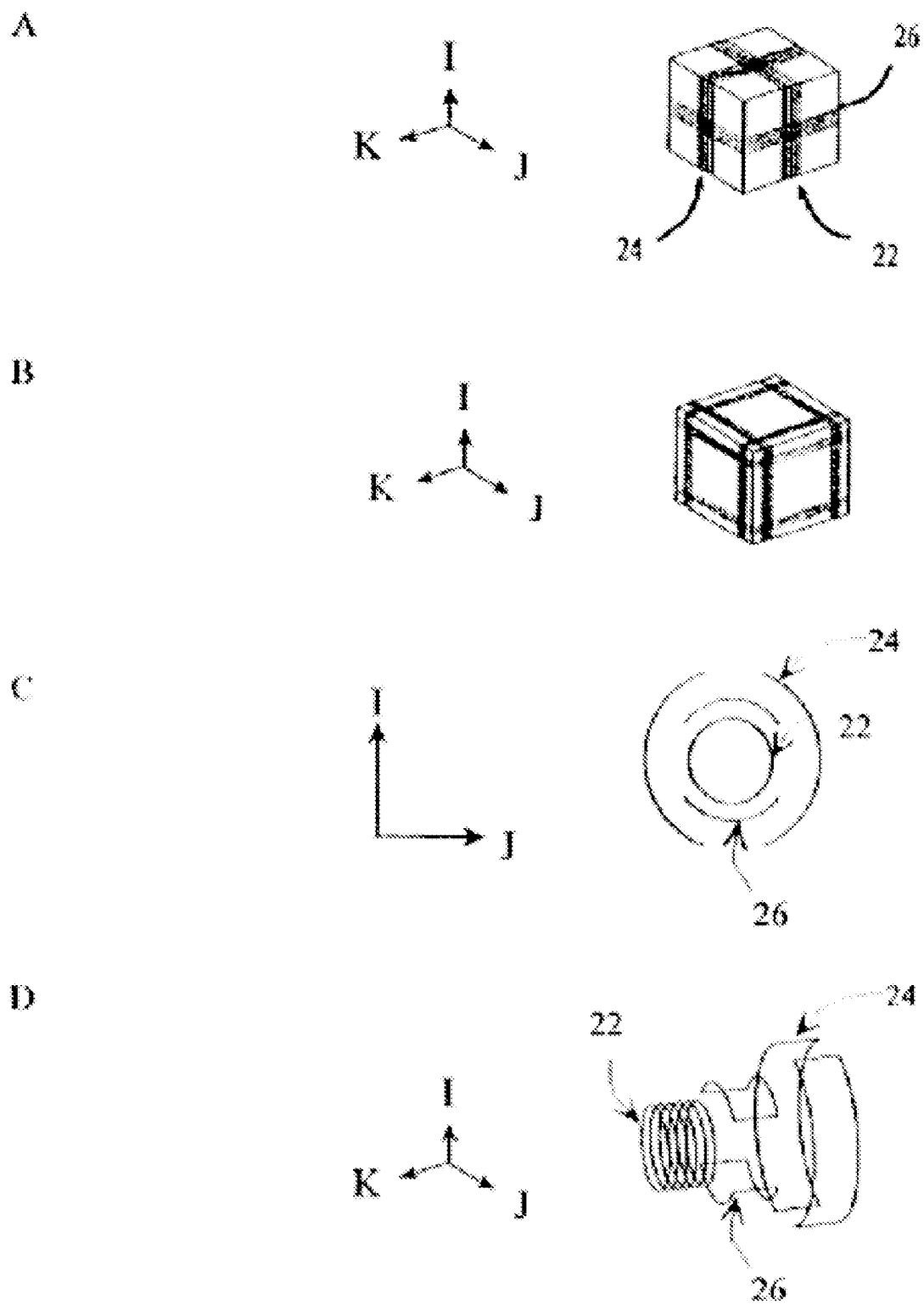

A potential configuration with three orthogonal coils is presented in FIG. 9A. This configuration is suitable for extra-corporeal applications, for example devices for minimal invasive procedures like biopsy guns or surgery instruments. Furthermore, the inner space of the sensor can be used to house electronic circuitry, powered by a miniature battery, for signal conditioning (e.g. filtration and amplification), signal transformation (e.g. into optical signal, or into frequency modulated (FM) signal), or for wireless transmission of the measured potentials.

A more complex configuration is presented in FIG. 9B, where three pairs of parallel coils can be used instead of three single coils, i.e., a total of 6 coils is used in a sensor. The major advantage of this configuration is a substantial increase in the accuracy of the tracking, since for each activation of any MRI gradient, six, rather than three, different potentials are induced, and a total of 18 measurements is available to estimate the 3 unknown location variables and the 3 unknown rotation angles with each cycle of scanning. Although the distance between each of the two parallel coils is small (e.g. 5-10 mm in the cubic configuration of FIG. 9A and 1-2 mm in the cylindrical configuration of FIGS. 9C and 9D), the steep gradients used with modern MRI scanners on one hand, and the availability of the exact distance between the two parallel coils on the other hand, enable the use of this information to increase the accuracy of the tracking.

A configuration in accordance with another embodiment is presented in FIGS. 9C and D, and includes a cylindrical coil and two pairs of "saddle" coils positioned in orthogonal directions to the cylindrical coils and to each other (FIG. 9C presents an axial view of the set of coils and FIG. 9D presents an isometric view of the two pairs of saddle coils and an inner cylindrical coils, all three coils are axially displaced to clarify the presentation). This configuration is specifically useful for catheter tracking since it has a hollow cylindrical structure and it can be fixed on the tip of any catheter without blocking the lumen of the catheter. It can be used with stent placement apparatus, with various diagnostic catheters (e.g. for intra-cardiac electrophysiology studies) and with current or future therapeutic catheters (e.g. RF ablation, laser ablation, percutaneous transmyocardial revascularization (PMR), targeted drug delivery, local genetic substance placement, etc.).

In a variation of the cylindrical hollow configuration the two pairs of "saddle" coils may be replaced by two planar coils, which may be positioned inside or outside the lumen of the cylindrical coil. Although this configuration partially blocks the catheter lumen, it is simpler to manufacture and may be useful with applications which do not require free lumen.

The sensors can be assembled from individual coils, for example by gluing 6 small flat coils on the 6 surfaces of a cube. On a catheter, one pair of coils has a cylindrical shape and can be directly wired over the shaft of the catheter, while the two other pairs have a saddle shape, and can be glued around the cylindrical coils. Another potential approach for the construction of the multi-coil sensor is by using flexible printed electrical circuits, which include all the coils and are folded to achieve the 3-dimensional shape.

Clinical Applications

The determined location and orientation of the sensor can be transferred to the MRI scanner in real-time and used for various tasks, for example for real-time control of the scanning plane, to display the location and orientation of the object or the device with the tracking sensor on the MR image, to correct motion artifacts. Potential clinical applications of the invention can be divided into applications for diagnostic MR imaging and for interventional MRI.

Diagnostic MRI: A major problem with MR imaging is motion artifacts due to patient movement. With high-resolution scanning, which may require image acquisition during many seconds and even minutes, patient movement and breathing may induce motion artifacts and blurred images. MR scanning is specifically sensitive to movements during phase contrast angiography, diffusion imaging, and functional MRI with echo-planar imaging (EPI). Using the present invention for real-time determination of the location and orientation of the scanned object can reduce the effect of motion on the MR scans by real-time control and correction of the scanning plane, in order to compensate for the movement, or by post-acquisition image processing. By using specific activation patterns designated for tracking, the real-time determination of the location and orientation can be made more frequently.

Interventional MRI: The sensor can be used with various devices, like miniature tools for minimally invasive surgery, catheters inside blood vessels, rigid and flexible endoscopes, biopsy and aspiration needles. It can be used to measure the location of the device with respect to the MRI coordinate system and to enable the MR scanner to present the device location on the MR images, as visual feedback to the operator, or to calculate and display the line of current orientation to assist the operator to steer the device into a specific target. Another potential application is to slave the MRI plane of imaging to the tracking sensor, for example to apply high resolution imaging on a small volume around the site of a catheter, for better imaging of the region of interest to improve diagnostic performance or to control the effect of an intervention (e.g radio-frequency, cryo, or chemical ablation and laser photocoagulation can be monitored by temperature-sensitive MR imaging). Another potential application is to use the information of the location and orientation of the device in order to enable display of the MRI images in reference to the device local coordinate system, as if the operator is looking through the device and in the direction of the tip, similar to the use of optical endoscopes. One more application is to use the location tracking in order to mark location of previous interventions on the MRI image.

An application with great clinical importance, where using MRI guidance is of specific advantage, is percutaneous myocardial revascularization (PMR). PMR is typically performed during cardiac catheterization. A laser transmitting catheter is inserted through the femoral artery up through the aorta into the left ventricle of the heart. Based on prior perfusion studies (e.g. Thallium scan) or indirect information on viability of the myocardium (e.g. by measurement of local wall motion), the cardiologist applies laser energy to drill miniature channels in the inner portion of the heart muscle, which stimulates angiogenesis and new blood vessel growth. PMR potentially provides a less invasive solution (compared to bypass surgery) for ischemic heart disease patients which cannot be adequately managed by angioplasty or stent placement. It may also be used in conjunction with angioplasty or stents to treat areas of the heart not completely revascularized by a balloon or stent placement. Currently, PMR is exclusively done with X-ray guidance. The main advantage of MRI is the excellent performance of MRI in the assessment of myocardial blood perfusion, through the use of contrast agents. Thus rather than using indirect information on the location of poorly perfused regions, a diagnostic session of myocardial perfusion in the MRI scanner can be followed by immediate intervention, using the existing perfusion images and real-time tracking of the laser catheter with the disclosed tracking methodology. An additional advantage, unique to MRI, is the potential to control the intervention by high-resolution, real-time imaging of the myocardium during the application of the laser treatment. Furthermore, since PMR is typically performed on multiple locations, and good coverage of the treated myocardium should be achieved, marking the location of the treated locations on the perfusion image, using the location data of the tracking system, may provide optimal coverage of the diseased region.

Anatomically, the tracking sensor can be used for various diagnostic and interventional procedures inside the brain (internally through blood vessels or through burr holes in the skull), the cardiovascular system (heart chambers, coronary arteries, blood vessels), the gastro-intestinal tract (stomach, duodenum, biliary tract, gall bladder, intestine, colon) and the liver, the urinary system (bladder, ureters, kidneys), the pulmonary system (the bronchial tree or blood vessels), the skeletal system (joints), the reproductive tract, and others.

The invention claimed is:

1. A method of determining an instantaneous location and orientation of an object moving through a three-dimensional space within an imaging space of a magnetic resonance imaging apparatus comprising three gradient coils during operation of said magnetic resonance imaging apparatus, the method comprising:
producing gradient field maps for said gradient coils prior to a scanning operation of the magnetic resonance imaging apparatus, wherein said gradient field maps are produced using tracking gradient command parameters;
applying to said object a sensor for measurement of instantaneous values of magnetic fields which are generated by activation of said gradient coils within an imaging space of said magnetic resonance imaging apparatus;
activating gradient coils of said magnetic resonance imaging apparatus during said scanning operation of said magnetic resonance imaging apparatus in imaging mode gradient activation so as to produce a magnetic field used for imaging;

activating said gradient coils of said magnetic resonance imaging apparatus during said scanning operation of said magnetic resonance imaging apparatus using said tracking gradient command parameters in tracking mode gradient activation so as to produce a magnetic field used for tracking, wherein said magnetic field used for tracking is produced using only said three gradient coils without the need for RF activation;

measuring instantaneous values of magnetic fields which are generated in said sensor by the tracking mode activation of said gradient coils of said magnetic resonance imaging apparatus;

calculating predicted values of magnetic fields to be generated in said sensor by the tracking mode activation of said gradient coils by using said gradient field maps; and processing said measured instantaneous values of the magnetic fields generated by the tracking mode activation of said gradient coils, together with said calculated predicted values of magnetic fields to compute the instantaneous location and orientation of said object within said imaging space.

2. The method of claim 1, wherein said activating said gradient coils using said tracking gradient command parameters comprises choosing tracking gradient command parameters for bi-modally activating said gradient coils of said magnetic resonance imaging apparatus, wherein said bi-modal activation has a zero net effect on said imaging.

3. The method of claim 1, wherein said activating said gradient coils using said tracking gradient command parameters comprises measuring said command parameters.

4. The method of claim 1, wherein said activating said gradient coils using said tracking gradient command parameters comprises retrieving stored information on said command parameters.

5. The method of claim 1, wherein said activating said gradient coils using said tracking gradient command parameters comprises identifying an amplitude and rate of change of current flow of said tracking mode gradient activation signal.

6. The method of claim 1, wherein said activating said gradient coils using said tracking gradient command parameters is done during a quiet section of a cycle of said scanning operation.

7. The method of claim 1, wherein said activating said gradient coils using said tracking gradient command parameters is done during non-imaging time periods, resulting in a longer overall scan time.

8. The method of claim 1, wherein said activating said gradient coils using said tracking gradient command parameters is done by adding activations of all three gradients for each phase encode step.

9. The method of claim 1, wherein said activating said gradient coils using said tracking gradient command parameters is done by adding a single activation of a gradient coil for each phase encode step and toggling between the three gradient coils.

10. The method of claim 1, further comprising using a trigger signal to define the time of said activating said gradient coils using said tracking gradient command parameters.

11. The method of claim 1, wherein said applying to said object a sensor for measurement of instantaneous values of magnetic fields comprises applying a coil assembly including a plurality of sensor coils having axes of known orientation with respect to each other and including components in the three orthogonal planes.

12. The method of claim 1, wherein said sensor comprises sensor coils oriented in a known orientation, and wherein said processing said measured instantaneous values of the magnetic fields generated by the tracking mode activation comprises:

storing in memory said produced gradient field maps of each of the three gradient coils of said magnetic resonance imaging apparatus; and simultaneously estimating the location and the orientation of the sensor by processing said measured instantaneous values of the magnetic fields generated by the tracking mode activation together with said stored gradient field maps and the known relative orientation of the sensor coils.

13. The method of claim 1, wherein said processing is effected by an iterative optimization process.

14. The method of claim 13, wherein said iterative optimization process is effected in real time to determine the instantaneous location and orientation of said object in real time.

15. The method of claim 1, wherein said processing is done with an update rate faster than the rate of motion of the scanned object and use this position information to eliminate motion artifacts from the scanned images.

16. The method of claim 1, wherein said method is used for at least one of: diagnostic MRI, or interventional MRI.

17. The method of claim 1, wherein said producing gradient field maps is done by simulation.

18. The method of claim 1, wherein said producing gradient field maps is done by activating said gradient coils.

19. A system for determining an instantaneous location and orientation of an object moving through a three-dimensional space within an imaging space of a magnetic resonance imaging apparatus during operation of said magnetic resonance imaging apparatus, the system comprising:

a magnetic resonance imaging apparatus, comprising a set of three gradient coils, and a gradient activation control unit for controlling activation of said gradient coils, wherein said three gradient coils are configured to produce gradient fields for determining an instantaneous location and orientation of an object in said magnetic resonance imaging apparatus, wherein the gradient fields are generated by said gradient activation control unit according to tracking gradient command parameters;

a sensor placed on the object, said sensor for measurement of instantaneous values of magnetic fields which are generated by activation of said gradient coils within said imaging space of said magnetic resonance imaging apparatus;

means for producing gradient field maps for said gradient coils prior to a scanning operation of the magnetic resonance imaging apparatus, said gradient field maps produced using said tracking gradient command parameters;

a triggering mechanism for triggering of a tracking mode gradient activation signal, said tracking mode gradient activation signal for signaling that gradient fields are being generated in said magnetic resonance imaging apparatus by said gradient activation control unit according to said tracking gradient command parameters; and means for processing measured instantaneous values from said sensor of magnetic fields generated by the tracking mode gradient activation signal, together with calculated predicted values of magnetic fields to be generated in said sensor using said gradient field maps, to compute the instantaneous location and orientation of the object within said space.

20. The system of claim 19, wherein said sensor comprises a plurality of sensor coils having axes of known orientation with respect to each other and including components in three orthogonal planes.

21. The system of claim 19, wherein said sensor comprises a coil assembly including three pairs of sensor coils, in which one sensor coil in each pair has the same orientation as the other sensor coil in the respective pair, and in which each pair of sensor coils has a different orientation from the other pairs of sensor coils.

22. The system of claim 19, wherein said sensor comprises a coil assembly including a cylindrical sensor coil and two pairs of sensor coils positioned orthogonally with respect to each other and to the cylindrical sensor coil.

23. The system of claim 22, wherein said two pairs of sensor coils are curved and in a saddle relation to said cylindrical sensor coil.

24. The system of claim 22, wherein said two pairs of sensor coils are planar.

25. The system of claim 19, wherein said object is a medical instrument moving in the body of a person for medical diagnostic or treatment purposes.

26. The system of claim 19, wherein said sensor is at least one of: a passive coil sensor, a Hall-effect sensor, or any other suitable sensor.

27. The system of claim 19, wherein said triggered tracking mode gradient activation signal is a bi-modal signal.

28. The system of claim 19, wherein said tracking gradient command parameters comprise an amplitude and a rate of change of current flow of said tracking mode gradient activation signal.

\* \* \* \* \*